(12) United States Patent
Sato et al.

(10) Patent No.: US 11,404,482 B2
(45) Date of Patent: Aug. 2, 2022

(54) SELF-ALIGNED REPEATEDLY STACKABLE 3D VERTICAL RRAM

(71) Applicant: Intel Corporation, Santa Clara, CA (US)

(72) Inventors: Noriyuki Sato, Hillsboro, OR (US); Kevin O'Brien, Portland, OR (US); Eungnak Han, Portland, OR (US); Manish Chandhok, Beaverton, OR (US); Gurpreet Singh, Portland, OR (US); Nafees Kabir, Portland, OR (US); Kevin Lin, Beaverton, OR (US); Rami Hourani, Portland, OR (US); Abhishek Sharma, Hillsboro, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 887 days.

(21) Appl. No.: 16/024,684

(22) Filed: Jun. 29, 2018

(65) Prior Publication Data
US 2020/0006427 A1    Jan. 2, 2020

(51) Int. Cl.
*H01L 27/04* (2006.01)
*H01L 27/24* (2006.01)
*H01L 45/00* (2006.01)

(52) U.S. Cl.
CPC ........ *H01L 27/249* (2013.01); *H01L 45/1226* (2013.01); *H01L 45/1253* (2013.01);
(Continued)

(58) Field of Classification Search
CPC ............... H01L 27/249; H01L 45/1226; H01L 45/1253; H01L 45/146; H01L 45/147; H01L 45/1683; H01L 45/04; H01L 21/8229; H01L 21/8239; H01L 27/01; H01L 27/222; H01L 27/24; H01L 29/685;
(Continued)

(56) References Cited

U.S. PATENT DOCUMENTS 9,443,910 B1 * 9/2016 Fujiwara ................. H01L 45/08
9,564,587 B1 * 2/2017 Jo ........................... H01L 27/249
(Continued)

OTHER PUBLICATIONS

Bai, Yu et al.: "Study of Multi-level Characteristics for 3D Vertical Resistive Switching Memory", Scientific Reports, 4:5780, DOI: 10.1038/srep05780, Published Jul. 22, 2014, 7 pgs.

*Primary Examiner* — Samuel Park
(74) *Attorney, Agent, or Firm* — Schwabe, Williamson & Wyatt, P.C.

(57) ABSTRACT

An integrated circuit structure includes a first material block comprising a first block insulator layer and a first multilayer stack on the first block insulator layer, the first multilayer stack comprising interleaved pillar electrodes and insulator layers. A second material block is stacked on the first material block and comprises a second block insulator layer, and a second multilayer stack on the second block insulator layer, the second multilayer stack comprising interleaved pillar electrodes and insulator layers. At least one pillar extends through the first material block and the second material block, wherein the at least one pillar has a top width at a top of the first and second material blocks that is greater than a bottom width at a bottom of the first and second material blocks.

9 Claims, 10 Drawing Sheets

(52) U.S. Cl.
CPC .......... *H01L 45/146* (2013.01); *H01L 45/147* (2013.01); *H01L 45/1683* (2013.01)

(58) Field of Classification Search
CPC ................ H01L 29/792; H01L 29/8615; H01L 2027/11838; H01L 2924/13089; H01L 2924/14; H01L 27/11582; H01L 27/11556; H01L 27/1157; H01L 27/11524; H01L 45/1233; H01L 21/8221; H01L 27/2481
See application file for complete search history.

(56) References Cited

U.S. PATENT DOCUMENTS

| | | | |
|---|---|---|---|
| 2010/0019310 A1* | 1/2010 | Sakamoto ............. | H01L 29/792 257/324 |
| 2011/0284946 A1* | 11/2011 | Kiyotoshi ......... | H01L 27/11582 257/324 |
| 2013/0210211 A1* | 8/2013 | Vereen .................. | H01L 27/249 438/382 |
| 2015/0093702 A1* | 4/2015 | Nyhus ....................... | G03F 7/11 430/296 |
| 2015/0228337 A1* | 8/2015 | Okawa ............... | G11C 13/0002 365/51 |
| 2015/0372005 A1* | 12/2015 | Yon ................... | H01L 27/11582 257/5 |

* cited by examiner

SELF-ALIGNED REPEATEDLY STACKABLE 3D VERTICAL RRAM

TECHNICAL FIELD

Embodiments of the disclosure are in the field of integrated circuit structures and, in particular, self-aligned repeatedly stackable 3D vertical RRAM.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Embedded memory with non-volatile memory devices, e.g., on-chip embedded memory with non-volatility can enable energy and computational efficiency. A non-volatile memory device such as resistive random access memory (RRAM) device or magnetic tunnel junction (MTJ) memory device is coupled with selector element to form a memory cell. A large collection of memory cells forms a key component of non-volatile embedded memory. However, with scaling of memory devices, the technical challenges of assembling a vast number of memory cells presents formidable roadblocks to commercialization of this technology today.

DESCRIPTION OF THE EMBODIMENTS

Figure 1:
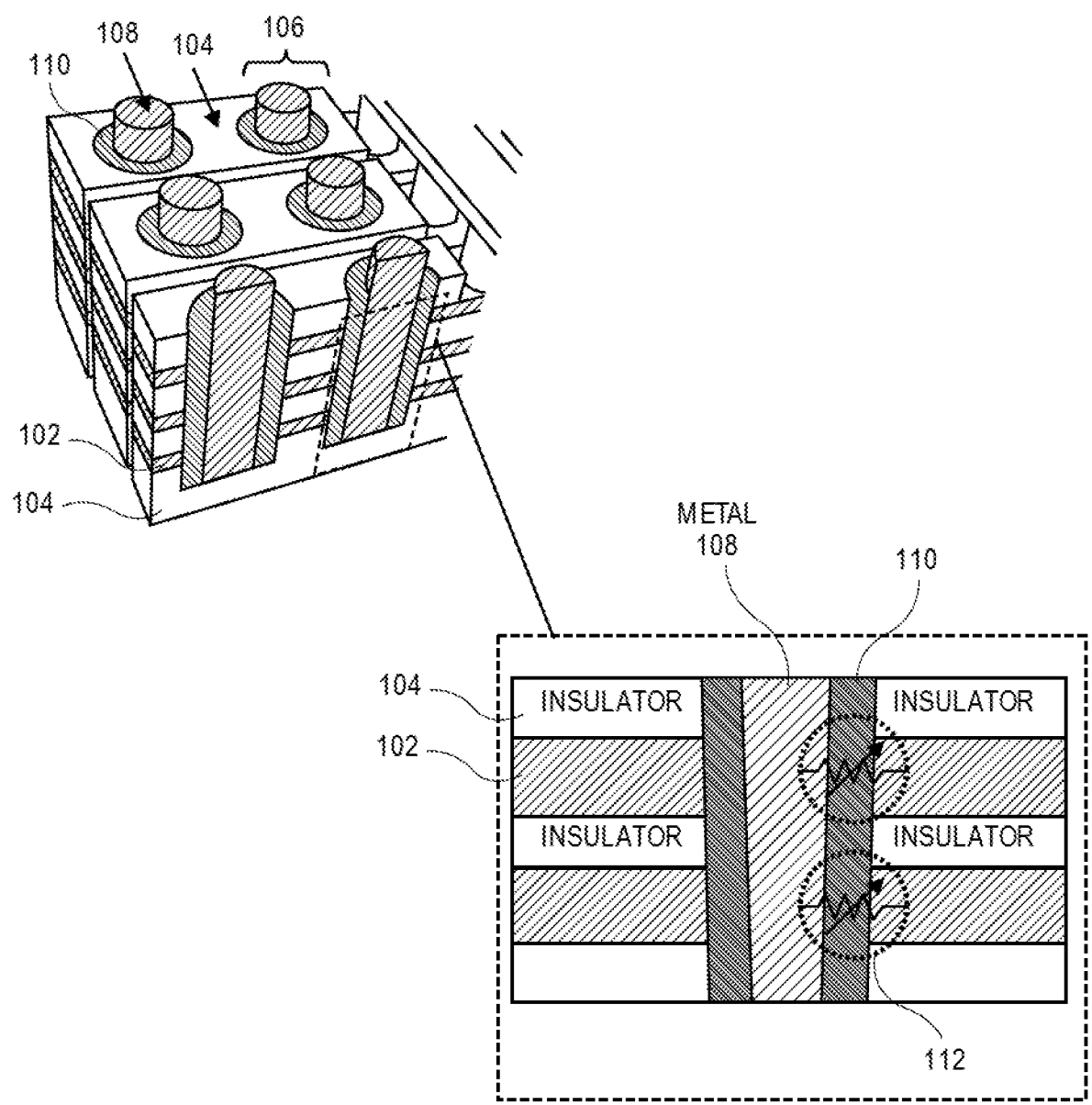
FIG. 1 illustrates a cross-sectional view of an angled view of a state-of-the-art vertical RRAM.

Embodiments for a self-aligned repeatedly stackable 3D vertical RRAM are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Non-volatile memory devices such as a resistive random access memory (RRAM) device depend on a phenomenon of resistance switching to store information. The non-volatile memory device functions as a variable resistor where the resistance of the device may switch between a high resistance state and a low resistance state. A non-volatile memory device may be coupled with a selector element to form a memory cell. The selector may be a volatile switching element that is placed in series with the non-volatile memory device. A large collection of such memory cells forms a key component of non-volatile embedded memory.

In accordance with one or more embodiments of the present invention, fabrication processes are described for a vertically integrated memory, such as 3D RRAM, that is self-aligned and repeatedly stackable without requiring the use of multiple lithography process steps to increase the number of layers or height of the RRAM. One or more embodiments described herein are directed to structures for and approaches to using a self-aligned and repeatedly stackable 3D vertical RRAM. In an embodiment, such a memory array is fabricated in the BEOL layers of an integrated circuit. The performance of such a memory may be faster than flash memory, and may be made with higher density than flash memory. In accordance with one or more embodiments of the present disclosure, a vertical string of memory elements is described. Such an architecture may provide a very dense memory architecture since it is a vertical rate in contrast to a planar memory array. The processes here in are also applicable magnetoresistive random-access memory (MRAM) and phase-change memory (PCRAM).

To provide context, FIG. 1 illustrates a cross-sectional view of an angled view of a state-of-the-art vertical RRAM. The dashed box shows an enlarged cross-section of the vertical RRAM. The vertical RRAM 100 includes a lattice array of interleaved metal plane electrodes 102 and insulator layers 104 (e.g., silicon nitride, silicon oxide and the like) having pillars 106 formed there through. Each of the pillars 106 comprise a pillar electrode 108 and switching layer 110 around the pillar electrode 108. The pillar electrode 108 may serve as a top electrode, while the plane electrode 102 may serve as a bottom electrode, and the switching layer 110 is located along sidewalls of the pillars 106 between the pillar electrode 108 and the plain electrode 102. The switching layers 110 are required for RRAM integration due to their non-linear/rectifying I-V characteristics which serve to minimize leakage current from such devices. Individual memory cells 112 are defined at the junction of the pillars 106 and the plane electrodes 102.

The process of fabricating the vertical RRAM may include the following steps: performing lithography to stack the insulator layers 104 and the plain electrodes 102 alternately; optionally etching the plain electrodes 102 to form staircases at an edge of the array; etching holes in the plane electrode 102 and insulator layers 104 and depositing one or more oxides along sidewalls of the holes to form the switching layer 110; and depositing a metal in a remainder of the hole to form the pillar electrodes 102; and separating the plane electrodes 102 to form neighboring memory cells 112.

Higher density RRAM may be achieved by stacking as many layers of plane electrodes 102 and insulator layers 104 as possible. However, when the interleaved plane electrodes 102 and insulator layers 104 are etched to form the pillars 106, it is not possible to create a perfectly vertical etch angle, resulting in the pillars 106 having sloped walls where the diameter/width of the pillars 106 increases with the number of stacked layers. Consequently, the number of layers that can be stacked is limited before the non-vertical pillars from adjacent cells come into contact. One solution to this problem is to perform multiple lithography steps to reset the etch angle. However, the issue is that increasing the number of lithography steps increases the fabrication cost of the RRAM.

Accordingly, example embodiments disclosed herein allow for the fabrication of a self-aligned repeatedly stackable 3D vertical RRAM that does not experience the above limitations. The example embodiments do not rely on repeated lithography steps to fabricate the self-aligned vertical RRAM array. Instead, the example embodiments are enabled through direct self-assembly (DSA) and processing sequences to repeatedly stack layers and increase the number of vertical memory cells without adjacent pillars becoming too close.

Figure 2A:
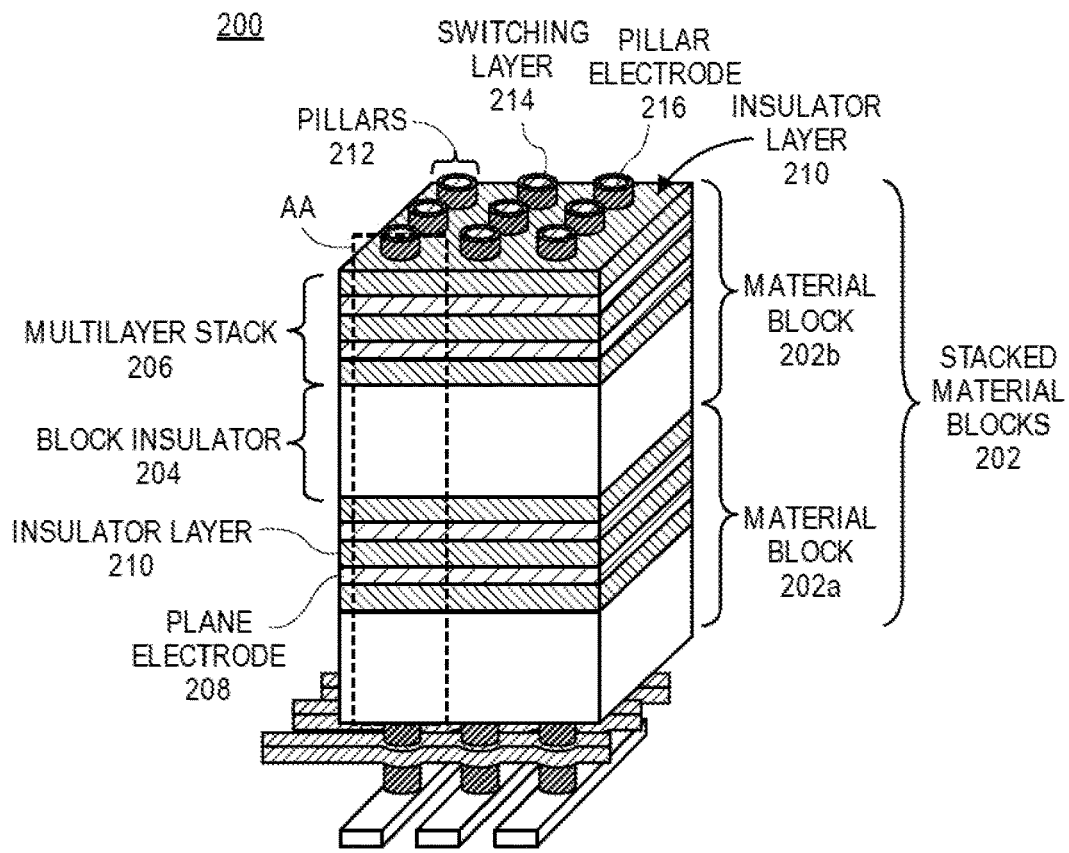
FIGS. 2A-2B illustrates a vertical resistive memory array fabricated in accordance with the present embodiments.
Figure 2B:
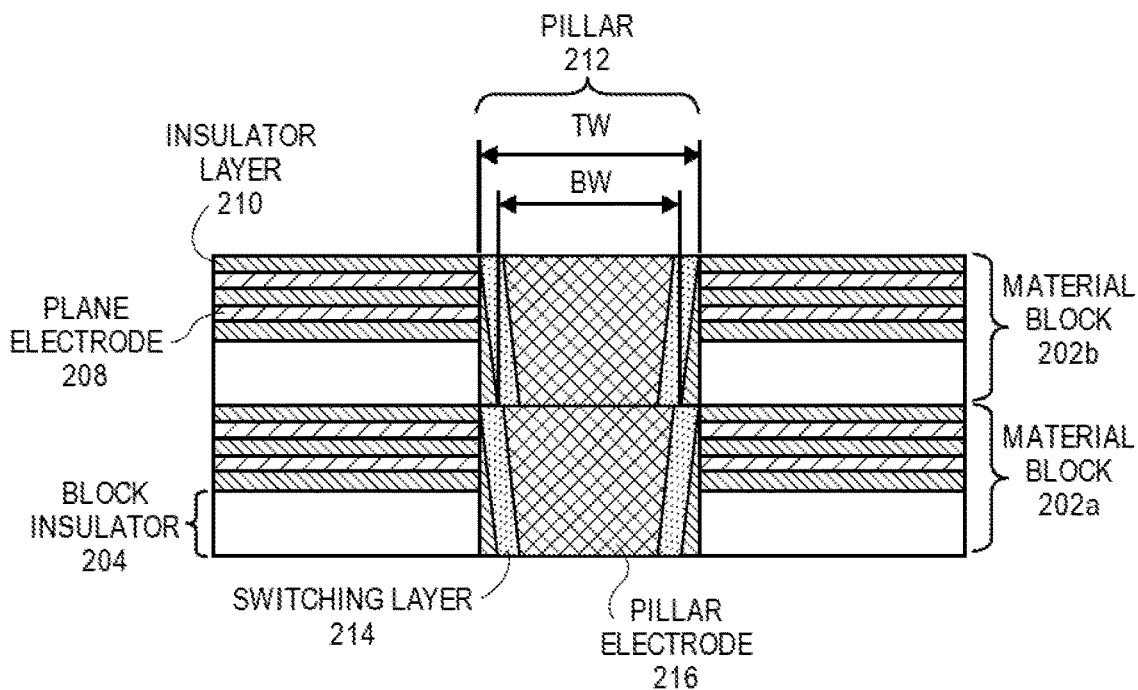

To exemplify the present embodiments, FIGS. 2A-2B are diagrams of a vertical resistive memory array fabricated in accordance with the present embodiments. FIG. 2A illustrates an angled three-dimensional view of an integrated circuit structure comprising the vertical memory array. In one embodiment, the vertical memory array 200 may represent a 3D RRAM array. FIG. 2B illustrates a cross-sectional views of the vertical memory array of FIG. 2B along line AA.

Referring to FIGS. 2A and 2B, the vertical memory array 200 is fabricated as stacked material blocks 202, where the width of the pillars is redefined in each of each the material blocks 202. Two stacked material blocks 202 are shown in this example, a first material block 202a and second material block 202b stacked on the first material block. Each of the material blocks 202 comprises a respective block insulator layer 204 and a multilayer stack 206 on the block insulator layer 204. The multilayer stack 206 comprises interleaved plane electrodes 208 and insulator layers 210. The plane electrodes 208 and insulator layers 210 are shown formed in a horizontal direction over a substrate 206, but are not limited to any particular orientation.

The multilayer stack 206 further includes a plurality of pillars 212 that extend through each of the material blocks 202. In one embodiment, the pillars 212 exit through a bottom one of the material blocks 202 and may be coupled to conductive lines, such as select lines and/or bitlines, as shown. Respective ones of the pillars 212 comprise a switching layer 214 and a pillar electrode 216, where the switching layer 214 is formed along sidewalls of the pillar 212. In one embodiment, the switching layer 214 and a pillar electrode 216 are concentric cylinders, which form a cylindrical pillar 212. However, the pillars 212, the switching layer 214 and pillar electrode 216 may be any shape, e.g., elliptical, square, rectangular and the like.

In one embodiment, the pillar electrode 216 may comprise any conductive metal, such as Cu, Ru, Co, W, Cu doped, Ag-doped, Au-doped, Ta-doped, other metals and silicides. In one embodiment, the pillar electrode 216 is less than 100 nm in width. In one embodiment, the switching layer 214 may comprise more than one layer (e.g., a memory layer and a selector layer). In one embodiment, the switching layer 214 may comprise materials such as TaOx, NbOx, VOx, Al2O3, HfOx, TaHfOx, TiOx, HfTiOx, HfNiOx, HfNbOx, TaNbOx, NiOx, PCMO, LSMO, In2O3, TaOx, NiOx, IGZO, ZnO, and composites thereof. In one embodiment, the switching layer 214 may be approximately 5-14 nm in thickness.

In an embodiment, the plane electrodes 208 may function as word lines. In one embodiment, the plane electrodes 208 may have a thickness of approximately 15-25 nm, or preferably 20 nm. In one embodiment, the plane electrodes 208 may comprise any conductive metal such as titanium nitride or platinum, for example. In one embodiment, the insulator layers 210 may comprise any oxide or nitride, such as silicon nitride. In one embodiment, the insulator layers 210 may have a thickness of approximately 20 nm to 50 nm.

Referring to FIG. 2B, according the disclosed embodiments, the width of the pillars 212 is redefined in each of each material blocks 202. More specifically, the pillars 212 in respective ones of the material blocks 202 have a top width (TW) at a top of the material block 202 that is greater than a bottom width (BW) at a bottom of the respective material block 202 due to the non-vertical etch angle of the pillars 212. As will be appreciated, the dimensions of the pillars 212 in each of the material blocks 202 have substantially the same dimensions such that the TWs and the BWs of one material block 202a are equal to the TWs and the BWs of another material block 202b. In one embodiment, TW may be less than approximately 100 nm.

According the disclosed embodiments, the top widths are reset for each of the material blocks 202 by utilizing a direct self-assembly (DSA) processing sequence, with creates pillars 212 that are self-aligned from one material block 202 to the next. DSA utilizes principles of chemoepitaxy and graphoepitaxy to depose a block copolymer comprising first and second polymer components onto a top surface of each of the material blocks 202. An example of a block copolymer is polystyrene-b-polymethylmethacrylate (PS-b-PMMA), as shown in FIG. 3.

Figure 3:
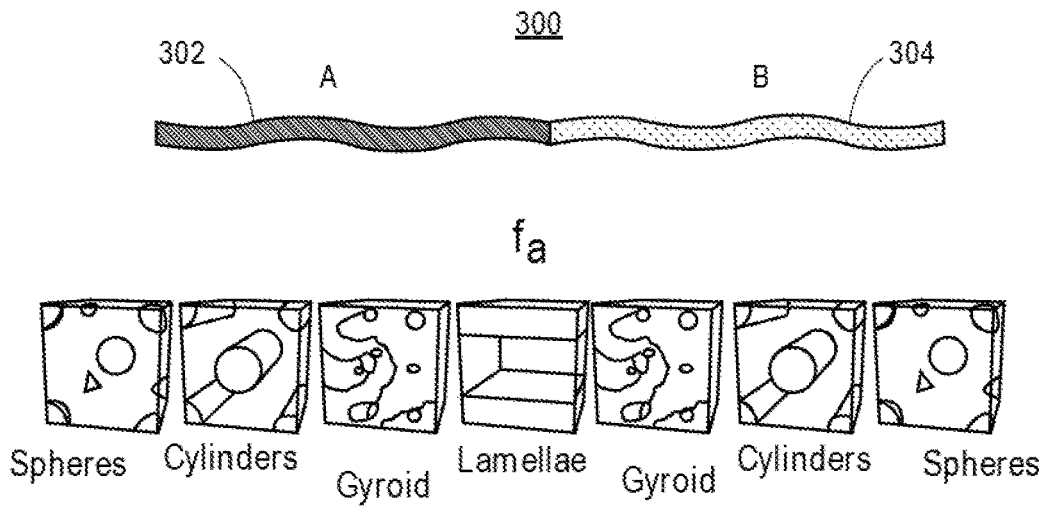
FIG. 3 illustrates a phase diagram for PS-b-PMMA, where one polymer is hereinafter referred to as PS (polystyrene) and the second polymer as PMMA (polymethylmethacrylate).

FIG. 3 illustrates a phase diagram for PS-b-PMMA, where one polymer is hereinafter referred to as PS (polystyrene) 302 and the second polymer as PMMA (polymethylmethacrylate) 304. Using chemoepitaxy, molecules/chemicals nominally called "brushes" are grafted (i.e., covalently bound) to the top surface of each new material block 202 to guide the polymer components to specific locations. The block copolymer distributes in a manner such that one of the polymer components 302, e.g., PS adheres to a conductive region, such as the pillar 212, while the second polymer component 304, e.g., PMMA, adheres to the material of the insulator layer 210. However, because the block copolymer is applied to the wafer/substrate on which the RRAM is formed, the substrate will have detectable amounts of the first polymer component and a second polymer component thereon. These molecules/brushes interact favorably with one of the polymer components (a 1-brush or single color scheme), or two brushes may be selected that interact with one polymer component but not the other (a 2-brush or two color scheme). These brushes/polymers for DSA process are commercially available. Similarly, block copolymers may also be commercially available. The polymers can be readily engineered to provide different properties. These molecules/chemicals can be readily engineered to provide different properties.

The disclosed embodiments are advantageous in the sense that a self-aligned pillar is introduced and replaces repeated lithography steps. This allows for a greater number of vertical devices to be stacked without exceeding the capability of etch processes. Consequently, the disclosed embodiments enable increased vertical scaling at less cost.

As an exemplary processing scheme involving fabrication of a self-aligned repeatedly stackable 3D vertical RRAM, refer to the following Figures illustrating views of various stages in a method of fabricating a vertical memory array integrated circuit structure in accordance with an embodiment of the present disclosure, where like components have like reference numerals.

Referring to FIGS. 4A-4H, cross-sectional views illustrating a method of fabricating an integrated circuit structure comprising vertical RRAM array 400 are disclosed, where like components from FIGS. 2A and 2B have like reference numerals.

Figure 4A:
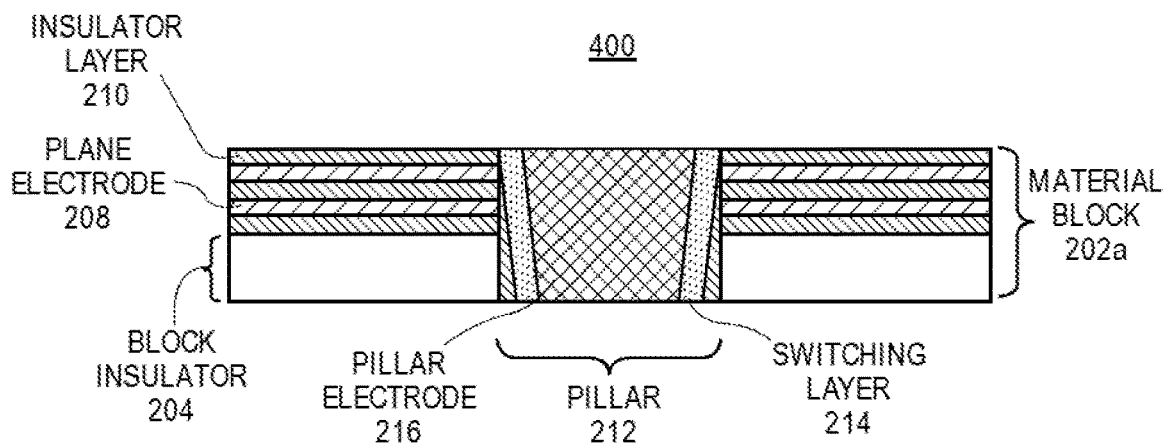
FIGS. 4A-4H illustrates a method of fabricating an integrated circuit structure comprising vertical RRAM array is disclosed.

FIG. 4A illustrates that the process may begin with forming material block 202a in which a block insulator layer 204 is formed over a substrate (not shown), and a multilayer stack 206 of alternating horizontal plane electrodes 208 and horizontal insulator layers 210 is formed over the block insulator layer 204. An array of pillars 212 is formed through multilayer stack 206 and the block insulator layer 204 using standard etch and lithographic processing. The switching layer 214 is conformingly formed on sidewalls of the pillars 212, followed by depositing the pillar electrode 216 material.

Although vertical RRAM array 400 shows two plane electrodes 208 and three insulator layers 210, any number of alternating conductor/insulator pairs may be utilized. The plane electrodes 208 may be comprised of a metal such as Pt, Ti, Al, Ta, Ti, Ru or of electrically conductive materials such as TiN or other suitable conductive metals or materials. The insulator layer 210 may be comprised of silicon dioxide, silicon oxynitride, silicon nitride, or other suitable insulating oxides, nitrides or carbides or of other materials. These depositions may be performed via a plasma-enhanced CVD process, an atomic-layer deposition process or via other suitable deposition processes.

Figure 4B:
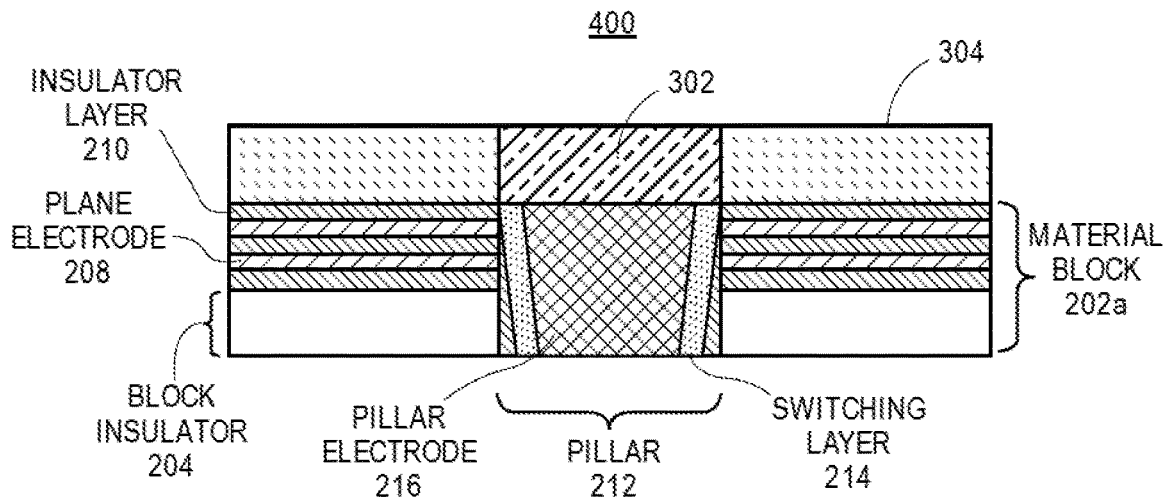

FIG. 4B illustrates the vertical RRAM array 400 after performing a direct self-assembly (DSA) process on a surface of the multilayer stack of the material block 202a to begin formation of second material block 202b, wherein a first polymer component, such as PS (polystyrene) 302 adheres to the pillar 212 and a second polymer component, such as PMMA (polymethylmethacrylate) 304 adheres to a top one of the insulating layer 210 of the material block 202a. Although the use of a PS/PMMA block copolymer will be described according to one embodiment, alternative block copolymers may also be used.

Direct self-assembly (DSA) is used to order the polymer components of the block copolymer in a defined manner, specifically, utilizing techniques of graphoepitaxy and chemoepitaxy. In graphoepitaxy, the surface of either the insulator layer 210 or the pillar 212 is coated to wet one of the polymer components. Using chemoepitaxy, molecules/chemicals nominally called "brushes" are grafted (i.e., covalently bound) to the top surfaces to guide the polymer components to specific locations. These molecules/brushes interact favorably with one of the polymer components (a 1-brush or single color scheme), or two brushes may be selected that interact with one polymer component but not the other (a 2-brush or two color scheme). These brushes/polymers for DSA process are commercially available. Similarly, block copolymers may also be commercially available. The polymers can be readily engineered to provide different properties. These molecules/chemicals can be readily engineered to provide different properties.

One key parameter of interest is the Flory-Huggins X parameter which describes how energetically favorable it is for the two polymer components 302 and 304 to mix. By controlling this parameter, the morphology of the resultant system (including the length of the polymer components 302 and 304) can be controlled when the polymer components 302 and 304 are mixed in contact with a metallic or insulating surface.

The bottom of FIG. 3 also illustrates a phase diagram for PS-b-PMMA demonstrating possible DSA morphologies as a function (f) of the first polymer component (A) 302, the second polymer component (B) 304, and the Flory-Huggins $X_n$ value. Once applied, the two different polymer components will segregate depending on the fractions of the first polymer component (A) 302 relative to the second polymer component (B) 304, and the effect of changing the relative ratios is shown in the resultant morphologies of FIG. 3. "A" and "B" can represent either PS or PMMA, since the phase diagram is symmetric about $f_A$=0.5. For example, PS-b-PMMA can be formulated in a symmetric 50:50 blend that produces lamellar self-assembled domains. If the fraction is adjusted to 30:70 or 70:30, the polymer produces cylinders of the minority fraction assembled in a hexagonal pattern in a sea of the majority fraction.

According to the present disclosure, DSA $f_A$ values that produce cylinder or spherical morphologies may be used to introduce self-aligned pillars 212 through multiple stacked material blocks 202. The length-scale of the morphologies resultant from polymer deposition from FIG. 3 may also be engineered as may be the thickness of the polymer coating applied to the pillars 212 and insulator layer 210. The X value is multiplied by the overall number of monomer units, n, in each block fraction of the chain to produce an $X_n$ value that dictates the intrinsic periodicity of the assembled system. Longer block copolymer chain lengths, with correspondingly higher $X_n$ values, produce longer intrinsic periodicities. In such a manner, a polymer can be engineered to form structures of different dimensions so that a polymer component that is adjacent to one conductive pillar 212 does not bridge to the polymer component adjacent to a neighboring insulating layer 210.

During the chemoepitaxy process, a PS-attractive thiol brush (not shown) is first grafted directly to a top surface of the pillars 212. The thiol brush bridges the top surface of the pillars 212 provided the width of pillars 212 is less than an intrinsic periodicity. If the width of the pillars 212 is greater than the characteristic length, the polymer will not fully bridge the pillars 212. Next, a second brush, based on an alcohol or phosphate end group is grafted to the block insulator layers 204 dielectric surfaces. Depending upon the Flory-Huggins $X_n$ value and the width of the pillars 212, the resultant morphology of the block copolymer is changed in a well-controlled and predictable manner. In one embodiment, the higher the Flory-Huggins $X_n$ value during the graphoepitaxy process, the more unfavorable it is for the block copolymers to mix. In one embodiment, an $X_n$ value of approximately may be 40-60 is selected, such that the first polymer component 302 (e.g., PS) adheres to the pillars 212, while the second polymer component 304 (e.g., PMMA) fills in the remaining regions of the material block 202a on the top insulator layer 210.

Referring again to FIG. 4B, the PS polymer component 302 is shown assembled over the pillars 212 and the PMMA polymer component 304 is shown assembled over the top insulator layer 210. In a manner described above, a BCP system may be customized for pillars 212 having of different widths/diameters. This process is highly repeatable. According to a further aspect of the example embodiments, the process may be tone inverted to swap the PS/PMMA regions in the resultant structure. For example, in an alternative embodiment, a PMMA attractive thiol brush, or a PS attractive hydroxyl brush, may be used such that the PS polymer component 302 assembles over the insulating layers 210 and the PMMA polymer component 304 assembles over the pillars 212.

Various embodiments presented herein discuss forming the DSA layers, where the block copolymer may be PS-b-PMMA. However, in other examples, any other appropriate type of polymers may also be used. Examples of such polymers include, but are not limited to, poly(styrene)-b-poly(2-vinylpyridine) (PS-b-P2VP), poly(styrene)-b-poly(4-vinylpyridine) (PS-b-P4VP), poly(styrene)-b-poly(acrylic acid) (PS-b-PAA), poly(styrene)-b-poly(ethylene glycol) (PS-b-PEG), poly(styrene)-b-poly(imide) (PS-b-PI), and poly(styrene)-b-poly(dimethylsiloxane) (PS-b-PDMS). For any of these block co-polymers additives can be introduce to modify the pitch, and $X_n$ value of the system. These systems and their processing may be at least in part analogous to the BCP comprising the PS-b-PMMA system discussed herein.

Figure 4C:
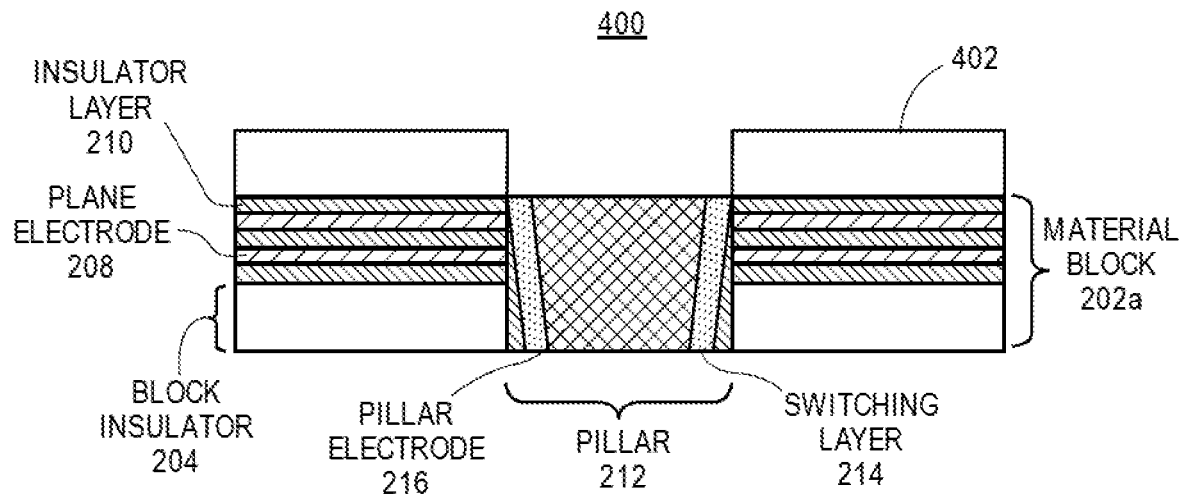

FIG. 4C illustrates the vertical RRAM array 400 after the PMMA polymer component 304 is removed from insulator layer 210 via a PMMA etch; a second block insulator 402 of a second material block 202b is formed on the first material block 202a in place of the removed PMMA; and the PS polymer component 302 is removed from the pillars 212 using an ash process.

Figure 4D:
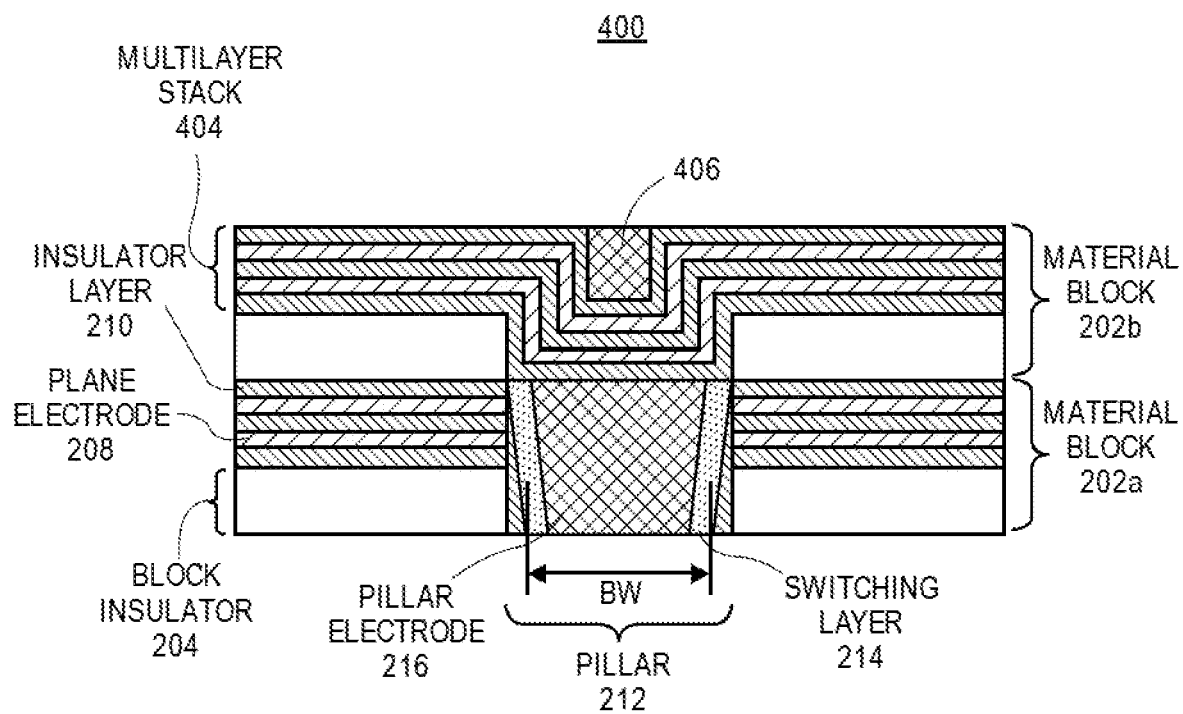

FIG. 4D illustrates the vertical RRAM array 400 after a multilayer stack 404 of alternating horizontal plane electrodes 208 and horizontal insulator layers 210 is conformally formed over the block insulator layer 402 of the second material block 202b, and a metal 406, such as one comprising the pillar electrode 212, is filled in and polished coplanar with a top of the multilayer stack 404.

Figure 4E:
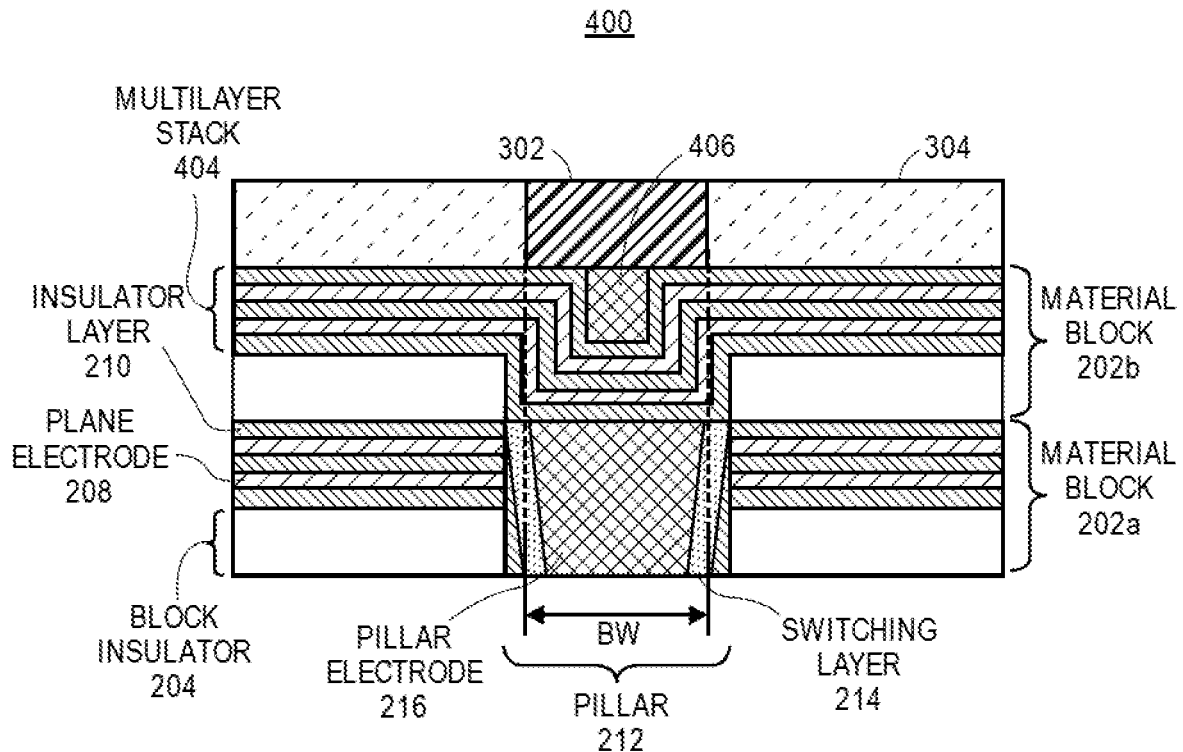
Figure 4F:
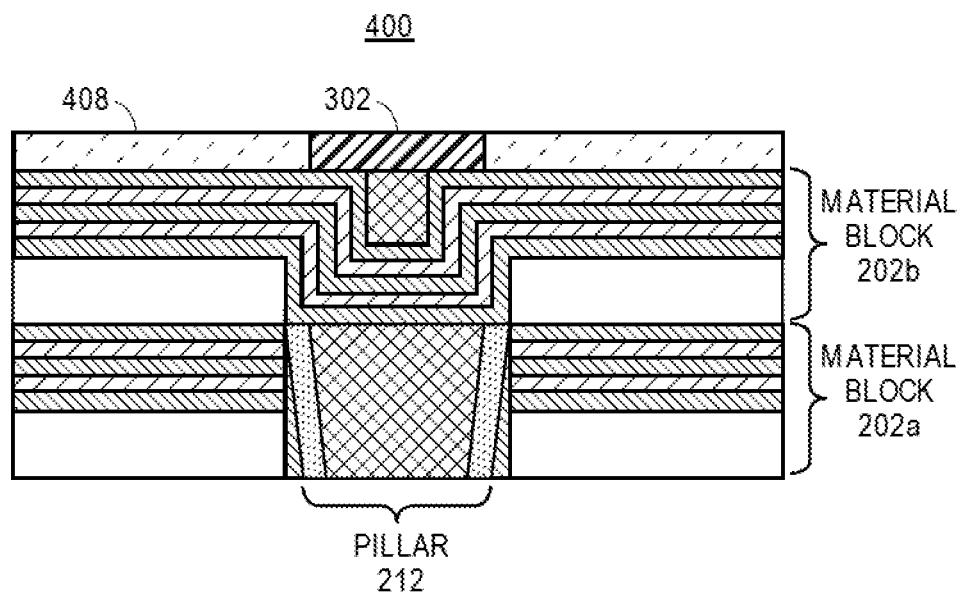
Figure 4G:
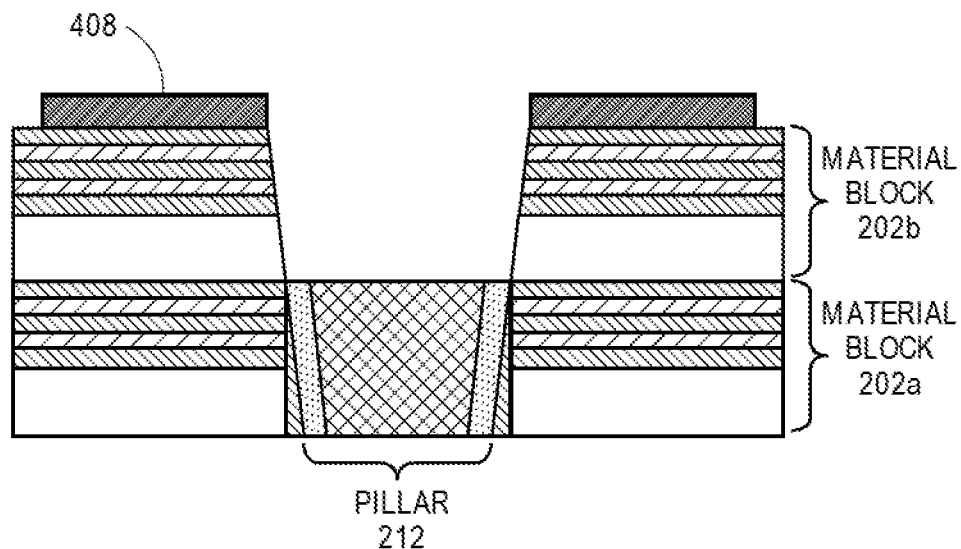
Figure 4H:
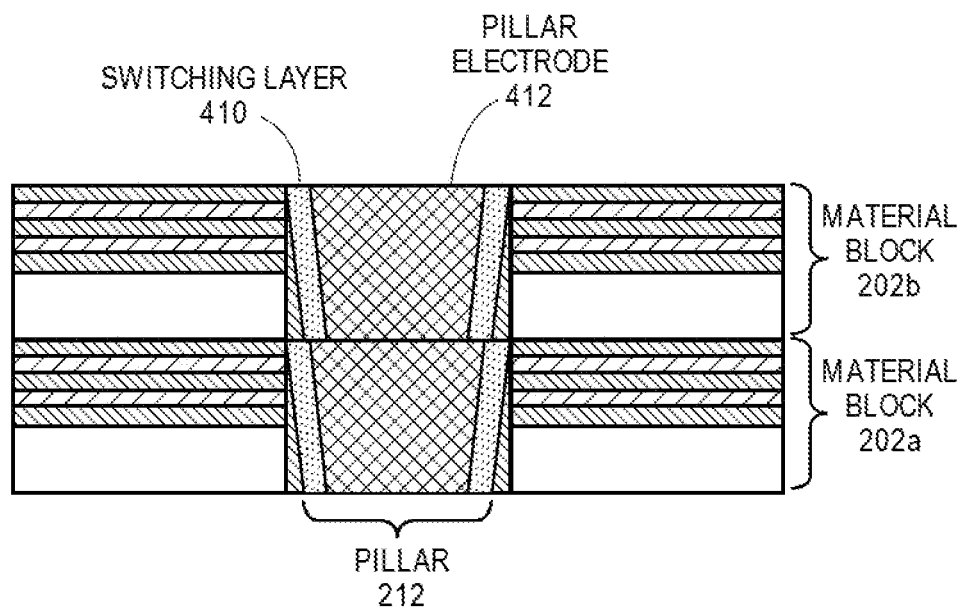

FIG. 4E illustrates the vertical RRAM array 400 after a second DSA process is performed on a top surface of material block 202b to define a location of the pillar 212 through the material block 202b that is self-aligned with a location of the pillar 212 in the material block 202a. The DSA process results in the PS polymer component 302 adhering to and being centered on the metal 406, and the PMMA component 302 adhering to the insulator layer 210. In one embodiment, the PS polymer component 302 has a length that matches the bottom width (BW) of the pillar at the bottom of the original material block 202a, effectively resetting the width of the pillar in the next material block 202b.

Figure F illustrates the vertical RRAM array 400 after the PMMA component 302 is removed via a PMMA etch and replaced with a hardmask 408, and both the PS polymer component 302 and the hardmask 408 are time polished to a predetermined thickness. In one embodiment the predetermined thickness is a minimum thickness required for downstream etching performed in Figure G. The PS polymer component 302 is used as a material that helps define the hardmask 408.

Figure G illustrates the vertical RRAM array 400 after the PS polymer component 302 is removed by an ash process and a dry etch is performed to remove materials thereunder, including the metal 406, down to the pillar 212 at the top of the material block 202a. Notice, the dry etch results in sloped sidewalls that effectively resets the width (TW) of the pillar at a top of the second material block 202b.

Figure H illustrates the vertical RRAM array 400 after the hardmask 408 is removed, and switching layer 410 is deposited on sidewalls and depositing and polishing the pillar to form a second portion of the pillar 212 in material block 202b to extend the pillar 212 through both the material blocks 202b and 202a. The pillar 212 is formed through each of the material blocks 202a and 202b, but the portions of the pillar 212 in each of the material blocks have a top width (TW) that is greater than a bottom width (BW), as shown and described in FIG. 2B.

In summary, an exemplary fabrication process of a self-aligned repeatedly stackable 3D vertical RRAM may including forming a first material block over a substrate, the first material block comprising a first block insulator layer, a first multilayer stack on the block insulator layer, the first multilayer stack comprising interleaved pillar electrodes and insulator layers. A second material block is formed on the first material block, where the second material block comprises a second block insulator layer, a second multilayer stack on the block insulator layer, the second multilayer stack comprising interleaved pillar electrodes and insulator layers. During fabrication of the first material block and the second material block, at least one pillar is formed that extends through the first material block and the second material block, wherein the at least one pillar is formed using a DSA process such that the pillar has a top width at a top of the first and second material blocks that is greater than a bottom width at a bottom of the first and second material blocks. At this point, the vertical memory is completed and additional processing may form a staircase contact or other contact structure.

Figure 5:
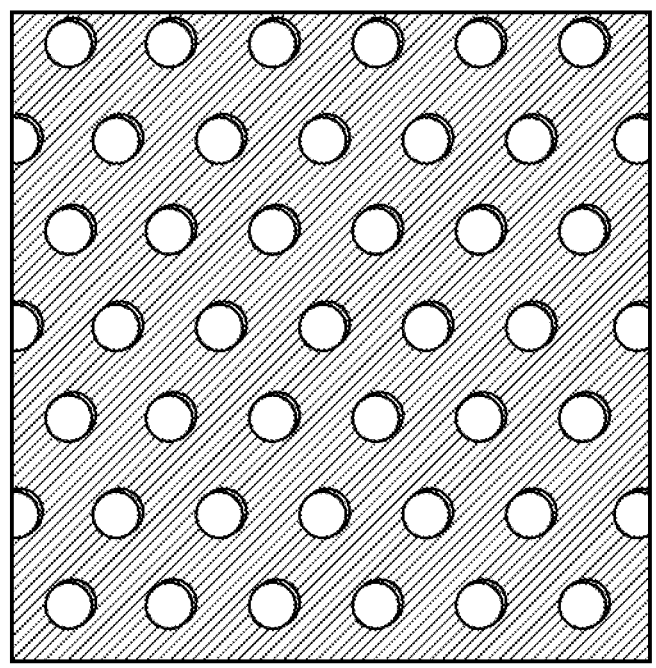
FIG. 5 illustrates a vertical RRAM configured as a hexagonal array.

FIG. 5 is a diagram illustrating a vertical RRAM configured as a hexagonal array. In one embodiment, arranging the RRAM as the hexagonal array 500 is preferred for the DSA process and results in high packing density.

The disclosed embodiment describe a DSA (direct self-assembly) process for fabricating a RRAM to increase the height of the RRAM and the number of RRAM layers without multiple lithography steps. The above process may be applied to other memory types such as magnetoresistive random-access memory (MRAM) and phase-change memory (also known as PCRAM, PCM, PCME, PRAM, OUM (ovonic unified memory) and C-RAM or CRAM (chalcogenide RAM)).

The integrated circuit structures described herein may be included in an electronic device. As an example of one such apparatus, FIGS. 6A and 6B are top views of a wafer and dies that a self-aligned repeatedly stackable 3D vertical RRAM, in accordance with one or more of the embodiments disclosed herein.

Figure 6B:
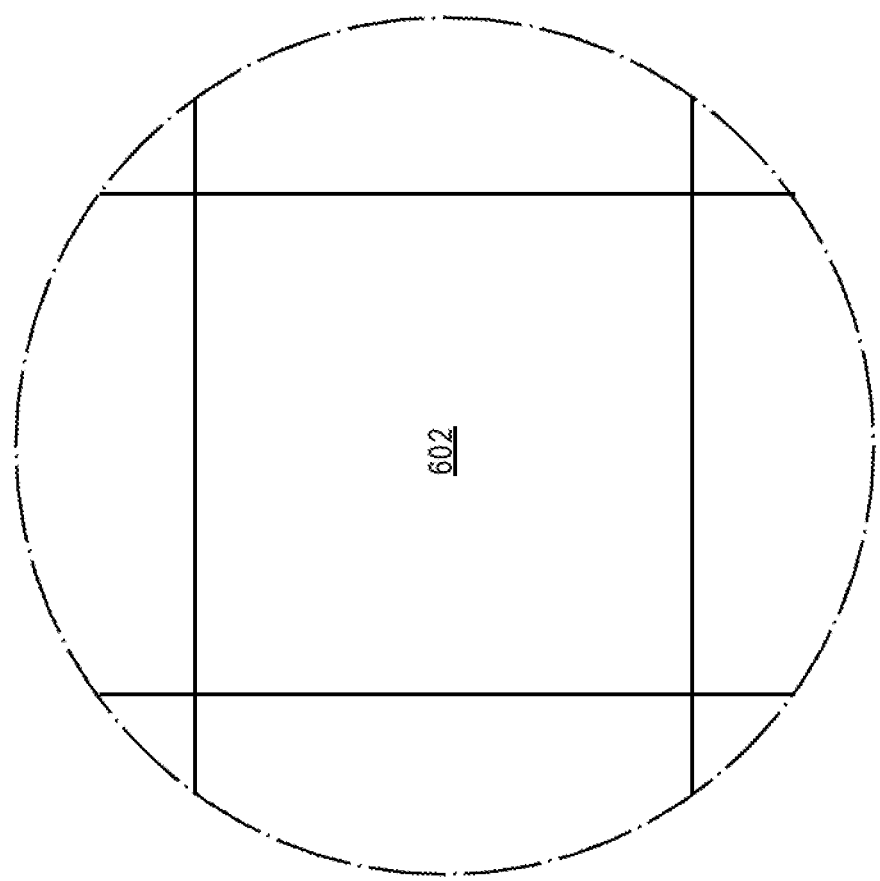
FIGS. 6A and 6B are top views of a wafer and dies that a self-aligned repeatedly stackable 3D vertical RRAM, in accordance with one or more of the embodiments disclosed herein.
Figure 6A:
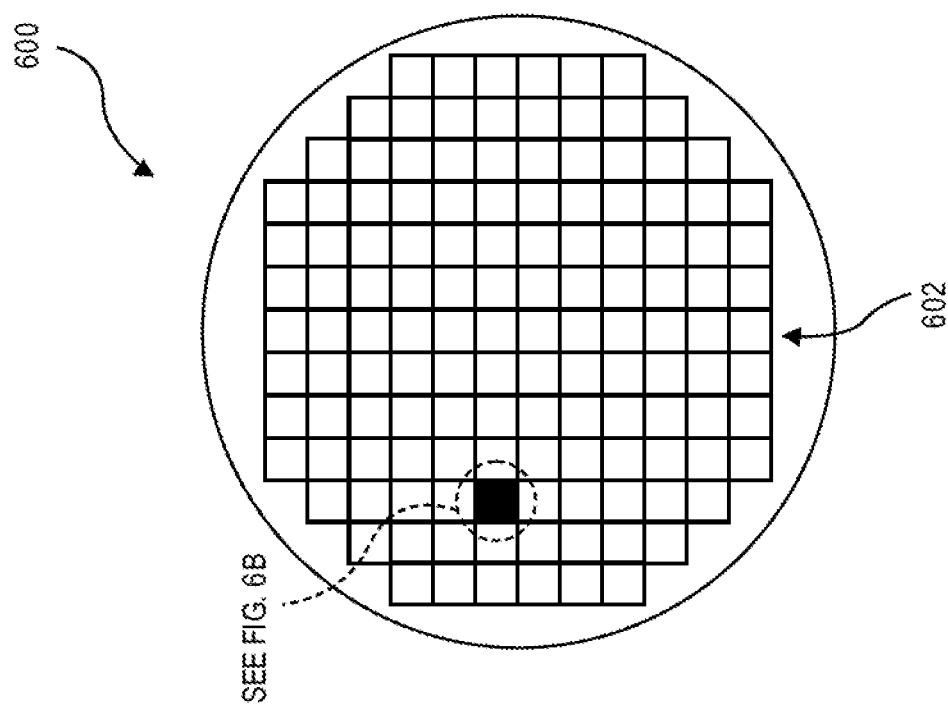

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including self-aligned repeatedly stackable 3D vertical RRAM, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more self-aligned repeatedly stackable 3D vertical RRAM and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
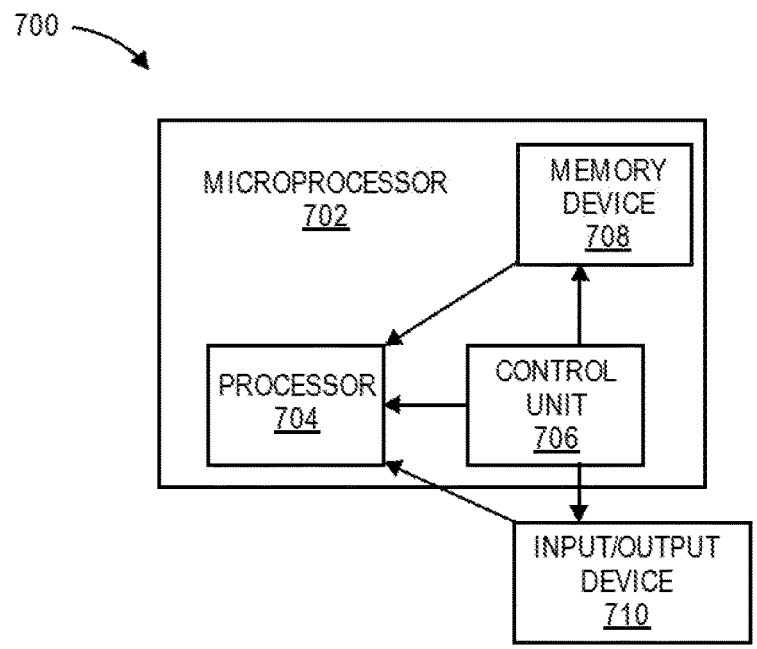
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a vertical memory array as described in the present description. In an embodiment, the memory device 708 is embedded in the microprocessor 702, as depicted in FIG. 7. In an embodiment, the processor 704, or another component of electronic system 700, includes a self-aligned repeatedly stackable 3D vertical RRAM, such as those described herein.

Figure 8:
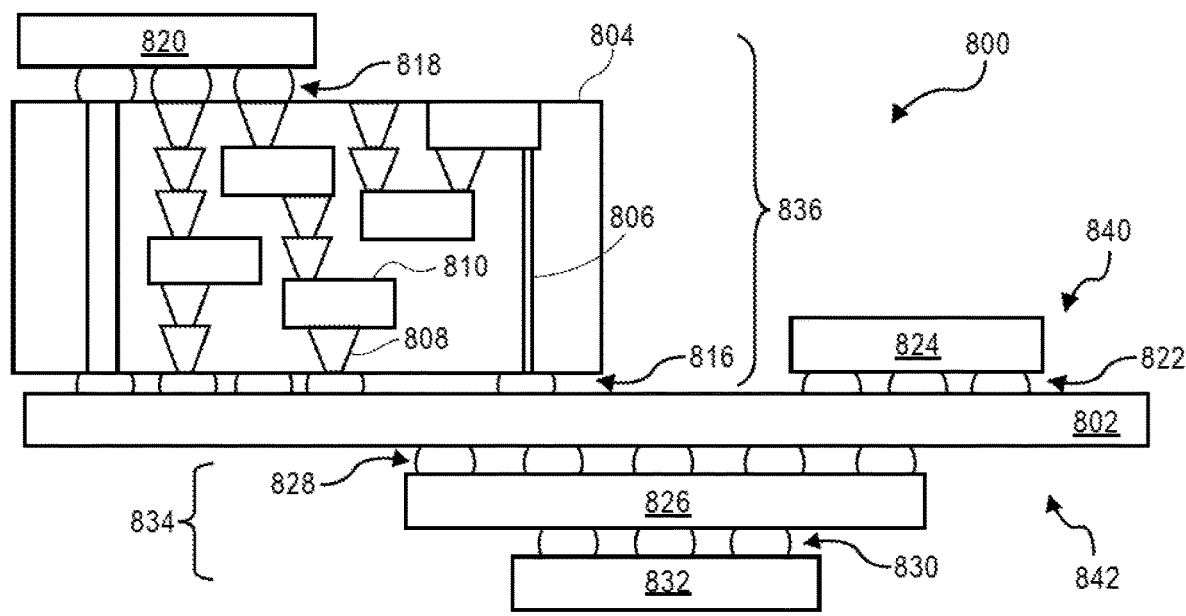
FIG. 8 is a cross-sectional side view of an integrated circuit (IC) device assembly that may include a self-aligned repeatedly stackable 3D vertical RRAM, in accordance with one or more of the embodiments disclosed herein.
Figure 9:
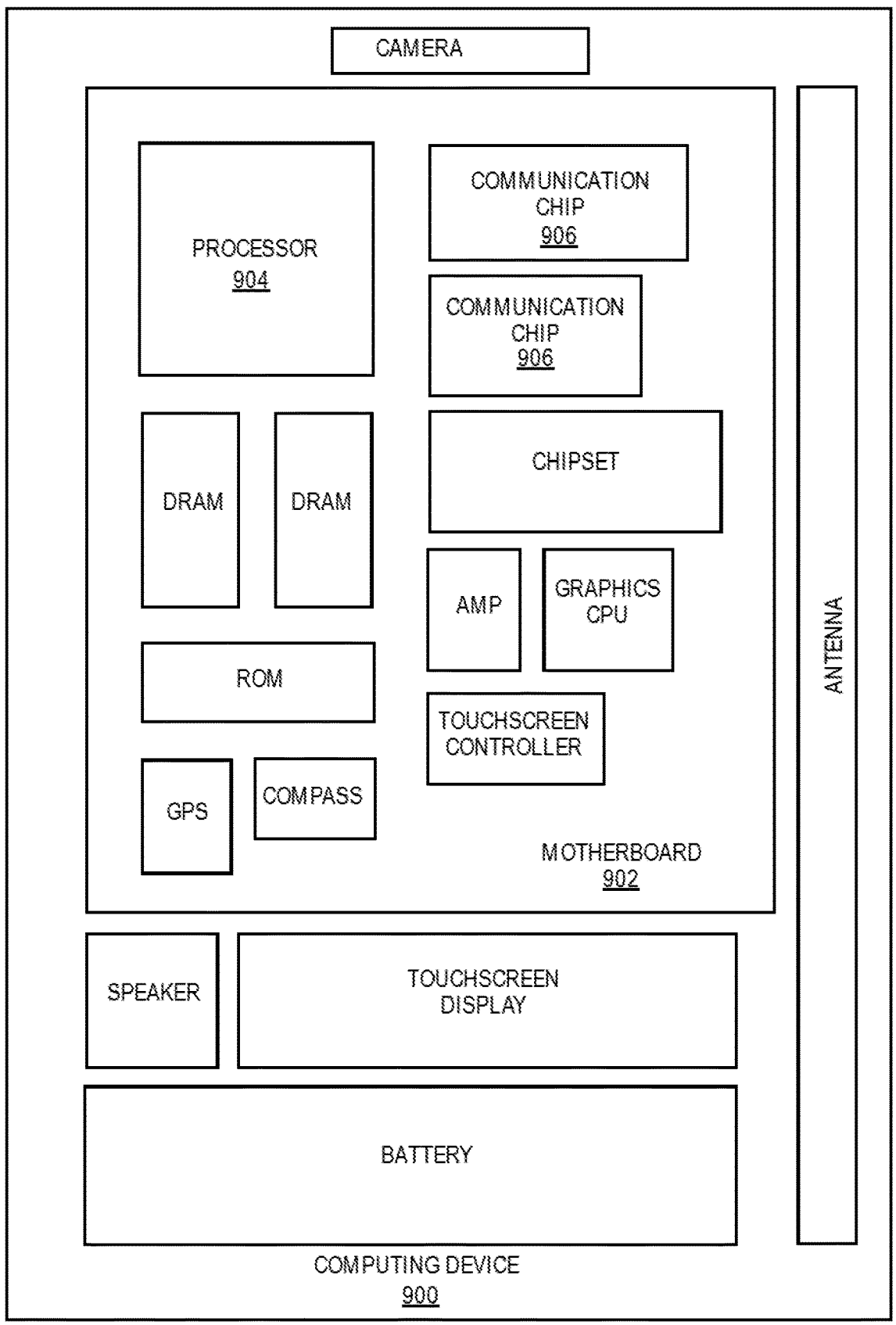
FIG. 9 illustrates a computing device in accordance with one implementation of the disclosure.

FIG. 8 is a cross-sectional side view of an integrated circuit (IC) device assembly that may include a self-aligned repeatedly stackable 3D vertical RRAM, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of self-aligned repeatedly stackable 3D vertical RRAM, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 818. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 602 of FIG. 6B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 818 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 818, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 818 discussed above, and the IC packages 826 and 832 may take the form of any of the embodiments of the IC package 820 discussed above. The package-on-package structure 834 may be configured in accordance with any of the package-on-package structures known in the art.

The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.8 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes a self-aligned repeatedly stackable 3D vertical RRAM, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes a self-aligned repeatedly stackable 3D vertical RRAM, in accordance with implementations of embodiments of the disclosure.

In further implementations, another component housed within the computing device 900 may contain an integrated circuit die that includes a self-aligned repeatedly stackable 3D vertical RRAM, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises a first material block comprising a first block insulator layer and a first multilayer stack on the first block insulator layer, the first multilayer stack comprising interleaved pillar electrodes and insulator layers. A second material block stacked is on the first material block comprising a second block insulator layer; and a second multilayer stack on the second block insulator layer, the second multilayer stack comprising interleaved pillar electrodes and insulator layers. At least one pillar extends through the first material block and the second material block, wherein at least one pillar has a top width at a top of the first and second material blocks that is greater than a bottom width at a bottom of the first and second material blocks.

Example Embodiment 2

The integrated circuit structure of example embodiment 1, the top width is less than approximately 100 nm.

Example Embodiment 3

The integrated circuit of claim 1 or 2, wherein the at least one pillar is self-aligned from the second material block to the first material block.

Example Embodiment 4

The integrated circuit of claim 1, 2 or 3, wherein the at least one pillar exits the bottom of the first material block and is coupled to at least one of selector lines and bit lines.

Example Embodiment 5

The integrated circuit of claim 1, 2, 3, or 4, wherein the at least one pillar comprises a switching layer and a pillar electrode, wherein the switching layer is formed along sidewalls of the pillar.

Example Embodiment 6

The integrated circuit of claim 0, wherein the pillar electrode comprises a conductive metal including at least one of Cu, Ru, Co, and W.

Example Embodiment 7

The integrated circuit of claim 0, wherein the switching layer comprise at least one of TaOx, NbOx, VOx, Al2O3, HfO2, TiOx, and NiOx.

Example Embodiment 8

The integrated circuit of claim 0, wherein the switching layer is approximately 5-14 nm in thickness and the pillar electrode is less than approximately 100 nm in width.

Example Embodiment 9

The integrated circuit of claim 1, 2, 3, 4, 5, 6, 7 or 8, wherein the first and second material blocks are formed over a substrate on which a block copolymer is formed thereon, the block copolymer comprising a first polymer component and a second polymer component of a direct self-assembly (DSA) process.

Example Embodiment 10

The integrated circuit of claim 0, wherein the first polymer component and the second polymer component comprise a polystyrene (PS) component and polymethylmethacrylate (PMMA) component, respectively.

Example Embodiment 11

A method of fabricating a vertical memory array comprises forming a first material block over a substrate, the first material block comprising a first block insulator layer, a first multilayer stack on the block insulator layer, the first multilayer stack comprising interleaved pillar electrodes and insulator layers. A second material block is formed on the first material block, where the second material block comprises a second block insulator layer, a second multilayer stack on the block insulator layer, the second multilayer stack comprising interleaved pillar electrodes and insulator layers. During fabrication of the first material block and the second material block, at least one pillar is formed that extends through the first material block and the second material block, wherein the at least one pillar is formed using a DSA process such that the pillar has a top width at a top of the first and second material blocks that is greater than a bottom width at a bottom of the first and second material blocks.

Example Embodiment 12

The method of example embodiment 11, the top width is less than approximately 100 nm.

Example Embodiment 13

The method of claim 11 or 12, wherein the at least one pillar is self-aligned from the second material block to the first material block.

Example Embodiment 14

The method of claim 11, 12, or 13, wherein the at least one pillar exits the bottom of the first material block and is coupled to at least one of selector lines and bit lines.

Example Embodiment 15

The method of claim 11, 12, 13 or 14, wherein the at least one pillar comprises a switching layer and a pillar electrode, wherein the switching layer is formed along sidewalls of the pillar.

Example Embodiment 16

The method of claim 15, wherein the pillar electrode comprises a conductive metal including at least one of Cu, Ru, Co, and W.

Example Embodiment 17

The method of claim 15, wherein the switching layer is selected from a group comprising TaOx, NbOx, VOx, Al2O3, HfOx, TaHfOx, TiOx, HfTiOx, HfNiOx, HfNbOx, TaNbOx, NiOx, PCMO, LSMO, In2O3, TaOx, NiOx, IGZO, ZnO, and composites thereof.

Example Embodiment 18

The method of claim 15, wherein the switching layer is approximately 5-14 nm in thickness and the pillar electrode is less than approximately 100 nm in width.

Example Embodiment 19

The method of claim 11, 12, 13, 14, 15, 16, 17 or 18, wherein the first and second material blocks are formed over a substrate on which a block copolymer is formed thereon, the block copolymer comprising a first polymer component and a second polymer component of a direct self-assembly (DSA) process.

Example Embodiment 20

The method of claim 19, wherein the first polymer component and the second polymer component comprise a polystyrene (PS) component and polymethylmethacrylate (PMMA) component, respectively.

Example Embodiment 21

A method of fabricating a vertical memory array comprises forming a first material block by: forming a first block insulator over a substrate, forming a first multilayer stack of alternating plane electrodes and insulator layers over the first block insulator; and forming at least one pillar through multilayer stack and the block insulator layer. A first direct self-assembly (DSA) process is performed on a surface of the first material block, wherein a first polymer component adheres to the at least one pillar and a second polymer component adheres to a top one of the insulator layers. The second polymer component is removed from insulator layer, a second block insulator of a second material block is formed in place of the removed second polymer component, and the first polymer component is removed from the at least one pillar. A second multilayer stack of alternating plane electrodes and insulator layers conformably is over the second block insulator, and filling in a top of the second multilayer stack with a metal comprising the at least one pillar. A second DSA process is performed is performed on a top surface of the second material block to define a location of the at least one pillar through the second material block that is self-aligned with a location of the at least one pillar in the first material block, wherein the first polymer component adheres to the metal and the second polymer component adheres to a top one of the insulator layers in the second material block. The second polymer component is removed and replaced with a hardmask and the hardmask and the first polymer component are polished to a predetermined thickness. The first polymer component is removed and the materials thereunder are etched, including the metal, down to the pillar at the top of the first material block. The hardmask is removed and a second portion of the pillar is formed in the second material block to extend the pillar through both the first material block and the second material block, wherein the portions of the pillar in the first material block and the second material block have a top width (TW) that is greater than a bottom width.

Example Embodiment 22

The method of example embodiment 21, further comprising forming the at least one pillar such that the top width is less than approximately 100 nm.

Example Embodiment 23

The method of example embodiment 21 or 22, further comprising: selecting DSA morphologies as a function (f) that produce cylinder or spherical morphologies for the first polymer component and the second polymer component.

Example Embodiment 24

The method of example embodiment 23, further comprising: utilizing polystyrene-bpolymethylmethacrylate (PS-b-PMMA) as the block copolymer.

Example Embodiment 25

The method of example embodiment 24, further comprising: selecting a Flory-Huggins $X_n$ value of approximately 40-60.

What is claimed is:
1. An integrated circuit structure, comprising:
   a first material block comprising:
      a first block insulator layer; and
      a first multilayer stack on the first block insulator layer, the first multilayer stack comprising interleaved pillar electrodes and insulator layers; and
   a second material block stacked on the first material block, comprising:
      a second block insulator layer; and
      a second multilayer stack on the second block insulator layer, the second multilayer stack comprising interleaved pillar electrodes and insulator layers;
   a plurality of conductive pillars extending through the first material block and the second material block, wherein the plurality of conductive pillars have a top width at a top of the first and second material blocks that is greater than a bottom width at a bottom of the first and second material blocks; and a substrate on which the first and second material blocks are formed, the substrate having detectable amounts of a first polymer component and a second polymer component.

2. The integrated circuit structure of claim 1, wherein the top width is less than approximately 100 nm.

3. The integrated circuit structure of claim 1, wherein the plurality of conductive pillars are self-aligned from the second material block to the first material block.

4. The integrated circuit structure of claim 1, wherein the plurality of conductive pillars exits the bottom of the first material block and is coupled to at least one of selector lines and bit lines.

5. The integrated circuit structure of claim 1, wherein the plurality of conductive pillars comprise a switching layer and a pillar electrode, wherein the switching layer is formed along sidewalls of the plurality of conductive pillars.

6. The integrated circuit structure of claim 5, wherein the pillar electrode comprises a conductive metal including at least one of Cu, Ru, Co, and W.

7. The integrated circuit structure of claim 5, wherein the switching layer is selected from a group comprising TaOx, NbOx, VOx, $Al_2O_3$, HfOx, TaHfOx, TiOx, HfTiOx, HfNiOx, HfNbOx, TaNbOx, NiOx, PCMO, LSMO, $In_2O_3$, TaOx, NiOx, IGZO, ZnO, and composites thereof.

8. The integrated circuit structure of claim 5, wherein the switching layer is approximately 5-14 nm in thickness and the pillar electrode is less than approximately 100 nm in width.

9. The integrated circuit structure of claim 1, wherein the first polymer component and the second polymer component comprise a polystyrene (PS) component and polymethylmethacrylate (PMMA) component, respectively.

* * * * *